United States Patent
Lang

(10) Patent No.: US 11,047,898 B2
(45) Date of Patent: Jun. 29, 2021

(54) VECTOR PROCESSING USING AMPLITUDE OR POWER DETECTORS

(71) Applicant: BAE SYSTEMS INFORMATION AND ELECTRONIC SYSTEMS INTEGRATION INC., Nashua, NH (US)

(72) Inventor: David A. Lang, San Diego, CA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 285 days.

(21) Appl. No.: 16/273,668

(22) Filed: Feb. 12, 2019

(65) Prior Publication Data
US 2020/0256911 A1 Aug. 13, 2020

(51) Int. Cl.
| G01R 31/00 | (2006.01) |
| G01R 31/08 | (2020.01) |
| G01R 31/11 | (2006.01) |
| G01R 27/28 | (2006.01) |

(52) U.S. Cl.
CPC .......... *G01R 31/088* (2013.01); *G01R 27/28* (2013.01); *G01R 31/086* (2013.01); *G01R 31/11* (2013.01)

(58) Field of Classification Search
CPC .... G01R 31/088; G01R 27/28; G01R 31/086; G01R 31/11; G01R 31/88; G01R 31/2822; G01R 31/2836
USPC ............................. 702/59, 106, 118; 324/533
See application file for complete search history.

(56) References Cited

U.S. PATENT DOCUMENTS

| 5,363,049 A | 11/1994 | Bullock et al. |
| 7,272,521 B1* | 9/2007 | Delos ..................... G01R 23/20 324/76.83 |
| 2003/0094937 A1* | 5/2003 | Soma ............... G01R 31/31725 324/76.39 |
| 2003/0202573 A1* | 10/2003 | Yamaguchi ............ G01R 29/26 375/226 |
| 2005/0031029 A1* | 2/2005 | Yamaguchi ...... G01R 31/31725 375/226 |
| 2005/0203711 A1* | 9/2005 | Taylor ...................... H04B 3/56 702/59 |
| 2005/0234662 A1* | 10/2005 | Niedzwiecki ............ H04B 3/46 702/60 |

(Continued)

OTHER PUBLICATIONS

Macrae, "Fault Location Using a Scalar System," 31st ARFTG Conference Digest, Mar. 12, 2007, pp. 55-62, IEEE.

(Continued)

*Primary Examiner* — Ly D Pham
(74) *Attorney, Agent, or Firm* — Sand, Sebolt & Wernow LPA; Scott J. Asmus

(57) ABSTRACT

A system and associated method determines the characteristics of an electric network including distance to a fault through the use of a power divider and a measuring device that measures a quantity from which voltage magnitude can be determined. The measuring device may be a power detector. The power detector may include a power meter to measure voltage and/or a power sensor to measure amplitude. Then, the results from the power detector are used in conjunction with a Hilbert transform to estimate the phase associated with at least two voltage magnitudes when a combined signal is a minimum phase signal.

16 Claims, 5 Drawing Sheets

(56) References Cited

U.S. PATENT DOCUMENTS

2005/0267696 A1* 12/2005 Yamaguchi ...... G01R 31/31709
  702/57
2008/0040060 A1*  2/2008 Hou ................ G01R 31/31937
  702/82
2012/0256639 A1* 10/2012 Pausini ............ G01R 31/31709
  324/613
2019/0273564 A1*  9/2019 Vella-Coleiro ........ H04B 17/17

OTHER PUBLICATIONS

Gledhill, "Frequency Domain Reflectometry Locates Elusive Waveguide Faults," EDN Network, Oct. 1, 1999, 3 pages.

* cited by examiner

VECTOR PROCESSING USING AMPLITUDE OR POWER DETECTORS

STATEMENT OF GOVERNMENT INTEREST

This invention was made with government support under Prime Contract No. F42620-03-D-0002 awarded by the U.S. Air Force. The government has certain rights in the invention.

TECHNICAL FIELD

The present disclosure relates to a system and method of determining the reflected amplitude and phase characteristics of an electric network including distance to a fault through the use of a power divider and a measuring device that measures a quantity from which voltage magnitude can be derived. More particularly, the measuring device may include a power meter to measure power, or a spectrum analyzer to measure voltage magnitude or power.

BACKGROUND

Characterization of electric networks has previously been performed by Vector Network Analyzers (VNAs) and Scalar Network Analyzers (SNAs). VNAs provide a coherent reference to which transmit and receive can be compared and thus can provide the phase and amplitude response of a system at specified frequencies. Based on the amplitude and phase information, a VNA can compute a time domain system response. SNAs detect amplitude or power information similar to a power meter. SNAs do not measure phase information.

Previous distance to fault analyzers take advantage of radio frequency (RF) signals and execute calculations using time domain reflectometry or frequency domain reflectometry (FDR). In time domain reflectometry (TDR) systems, RF pulses are sent into a system under test or a module under test and the system is able to determine a time period in which a portion of the signal is reflected back. Frequency domain reflectometry sends a continuous wave signal into a system and coherently collects a response. This is repeated at many equally spaced frequencies. Then the Inverse Discrete Fourier Transform is used to transform the collected data from the frequency domain to the time domain. The FDR process is similar to vector network analysis. The resulting signal is similar to the time domain reflectometry result. The FDR has an advantage over the TDR because it can use a much broader range of frequencies resulting in improved pulse resolution. A reflected signal can be indicative of a defect or a fault in a connector or other component. Thus, for example, if a reflection occurs at a time of 6 nanoseconds, a vector network analysis system can determine which connector corresponds to the reflected time period. Stated otherwise, if something is broken at 6 nanoseconds from the interface, then the reflectometry or vector network analysis can determine based on the cable length and the material within the cable or other feedlines, which component or cable is defective. Then that the electrical device such as a connector or a switch or other electrical element may be tested and replaced. When RF energy is put in to a cable or a transmission path and a portion of that cable or transmission path is broken, all or some of the RF energy is reflected back where it came from. This generates a large spike in reflected RF energy that can be determined and evaluated by a detector. Then, the system may determine based on the time at which the signal was reflected where the distance is based on the physical aspects of the cable and other hardware components in the system.

SUMMARY

Issues continue to exist with previous TDR or FDR systems in measuring a distance to a fault in an electrical system under test. Particularly, TDR or FDR system require specialized hardware with the capability to precisely capture time or phase information (or both) of the reflected signal. However, this hardware comes at a high price. Thus, a need continues to exist for an improved system to measure distance to fault in an electrical network under test. The present disclosure addresses these and other issues providing a system that is able to determine a distance to fault in the electrical network under test based on a power or amplitude information of a combined reference signal and reflected test signal.

In accordance with one aspect of the present disclosure, an exemplary embodiment may provide a single port vector network analysis measurement as well as reflectometry and distance to fault measurements. The system may take advantage of a broad range of frequencies. More particularly, the system may use a plurality of frequencies within a frequency band defined by the system. Frequency range and spacing of the frequencies depends on the time of travel of the signal to be measured and tested and the desired resolution for the results of the test. The system may combine hardware configurations of other scalar network analyzers using an improved processing method based on the Hilbert transform that is used to extract vector measurements from the power or amplitude information of the signal. This is distinct from previous attempts of using the Inverse Discrete Fourier Transform rather than the Hilbert transform. Based on the information from the Hilbert transform performed by the system, the distance to fault measurements can be computed and used to find common faults in physical components in an electrical system such as a coax cable, a connector, and other electrical components. In some instances, the results of the network analysis may be expressed in units of reflection coefficient, return loss, or VSWR. In another example, the system of the present disclosure measures the time it takes for a pulse to travel to and from a component in the device under test. From the time result, a distance to the component can be calculated based on the time of travel. This system measurers how much energy is reflected from the component in the device under test. When a high amount of energy is reflected, this is typically an indicator that the component is faulty or otherwise bad or not operating optimally. If no energy is reflected, then this is typically a good indicator that the electrical component is functioning normally. The reflection generated by the component may relate to a number of issues. In some examples, the component that reflects a signal may simply be installed incorrectly. Thus, the system can identify when a component should be operating normally but has been installed improperly. This could cue an operator to reinstall the same component in order to make the electrical system operate properly. Other reflections may be the result of a component failure in which case the component would need replaced. However, reflections may further be generated not from a component but in the cable or transmission lines connecting two components together. If there is a complete fault in a cable, such as an open or a short, then the reflection would be generated at that location. However, partial cable faults such as conductor damage or a minor shield may cause reflections of the signal that can be identified as well. Additionally, with respect to the connectors, corrosion or loosened connectors or abnormal pin alignment may also generate reflections in the signal which would be captured by the system and identified as a fault in the electrical network that the distance can be calculated based on the time of travel in the signal. Further, some devices such as a filter are designed to reflect energy at certain frequencies and pass energy at other frequencies. Thus, high reflected energy does not always indicate a failure. The system may account for devices that intentionally reflect signal energy.

An exemplary goal of the system and process is to compute the system response in time from the amplitude of the frequency spectrum of that time domain system response. The system uses a Hilbert transform to compute the phase at each frequency in the frequency spectrum. The Hilbert transform requires that we know the amplitude of a group of distinct equally spaced (across a band of frequencies) continuous wave signals. From that information, the system can compute the phase at each of those frequencies using the Hilbert transform. This method assumes that the original time domain response meets a condition known as minimum phase. From the phase and amplitude the system can convert the frequency domain signal to its real and imaginary parts. The Inverse Discrete Fourier Transform can then be computed and a time domain signal is the result. Thus, the aspects of the present disclosure provide an operator a tool that can quickly and easily determine which electrical components of a device under test are defective or have failed.

To compute precise timing and signal level information, a calibration procedure can be used. The calibration procedure is performed in the frequency domain on the vectors (real and imaginary signal array). Before the system measures a device under test, it makes measurements on calibrated devices in the same widely used processes that would be used to calibrate a Vector Network Analyzer. Data is collected for each frequency for at least one calibrated device. A typical calibration may include three calibrated devices: a short, an open, and a precision termination. The calibration technique aligns the phase and amplitude at each frequency. The corresponding time domain signal is a pulse at time zero when the calibrated connection is open or shorted. Adding a cable onto the calibrated connection results in a reflection (typically small) at the interface of the cable and the calibrated connection and one corresponding in time to the end of the cable. The length of the cable can be estimated based on the time of travel and the velocity factor of the material in the coaxial cable.

In another aspect, an exemplary embodiment of the present disclosure provides a method of determining a distance to a fault in an electric network through the use of a power divider and a measuring device that measures a quantity from which voltage magnitude can be determined, the method comprising: (i) generating a first signal at a first frequency from a signal source; (ii) transmitting the first signal to a first port of a power divider; (iii) splitting the first signal, via the power divider, into a first reference signal and a first test signal; (iv) transmitting the first test signal from a second port of the power divider to a device under test (DUT); (v) transmitting the first test signal through a portion of the DUT until the first test signal encounters a fault in the DUT, wherein first test signal reflects from the fault to define a first reflected test signal; (vi) transmitting the first reflected test signal to the second port of the power divider; (vii) combining, via the power divider, the first reflected test signal with the first reference signal to create a combined first reflected test and reference signal at the third port of the power divider; (viii) transmitting the combined first reflected and reference signal from the third port of the power divider to a measuring device that measures a quantity from which voltage magnitude can be determined; (ix) determining a voltage magnitude of the combined first reflected and reference signal with the measuring device; (x) storing the voltage magnitude (V) of the combined first reflected and reference signal; and repeating steps (i)-(x) for at least a second test signal at a different second frequency to determine a second voltage magnitude for a combined second reflected and reference signal.

This exemplary method or another exemplary method may further provide wherein step (ix) determining a voltage magnitude of the combined first reflected and reference signal with the measuring device includes: detecting an amplitude of the combined first reflected and reference signal via a spectrum analyzer. This exemplary method or another exemplary method may further provide wherein step (ix) determining a voltage magnitude of the combined first reflected and reference signal with the measuring device includes: detecting the power of the combined first reflected and reference signal via a power sensor and power meter combination and then determining the voltage magnitude from the measured power.

This exemplary method or another exemplary method may further provide storing, collectively, the voltage magnitude of the combined first reflected and reference signal and the combined second reflected and reference signal. This exemplary method or another exemplary method may further provide computing values (X) of the natural logarithm of at least two voltage magnitudes (V). This exemplary method or another exemplary method may further provide computing phase values (I) from a discrete Hilbert transform of a sequence of X values, wherein I is the estimate of the phase associated with each of the at least two voltage magnitudes when the combined signal is a minimum phase signal. This exemplary method or another exemplary method may further provide computing the signal (C) from the equation $C=V*\exp(j*I)$, where j equals the square root of −1; and the signal C is a complex number (i.e., vector) sequence in the frequency domain. This exemplary method or another exemplary method may further provide processing S, via an Inverse Discrete Fourier Transform, to determine a time and distance to fault measurement. This exemplary method or another exemplary method may further provide calibrating a port between the power divider and the DUT using calibration standards including at least one of a short, an open, or a load. This exemplary method or another exemplary method may further provide processing S, via an Inverse Discrete Fourier Transform, to determine a time and distance to fault measurement. This exemplary method or another exemplary method may further provide after calibrating, measuring frequency and time domain measurements on the DUT. This exemplary method or another exemplary method may further provide wherein the first and second test signals are part of a plurality of test signals that are equally spaced in the frequency domain.

This exemplary method or another exemplary method may further provide determining a frequency spacing interval between the first frequency and the different second frequency based on a time of travel of the signal to be measured and tested.

In another aspect, an exemplary embodiment of the present disclosure provides a method of determining a distance to a fault in an electric network through the use of a power divider and a measuring device that measures a quantity from which voltage magnitude can be determined and repairing the fault, the method comprising: (i) receiving a first signal at a first port of a power divider; (ii) splitting the first signal, via the power divider, into a first reference signal and a first test signal and then transmitting the first test signal from a second port of the power divider to a device under test (DUT); (iii) transmitting the first test signal through a portion of the DUT until the first test signal encounters a fault in the DUT, wherein the first test signal reflects a first reflected test signal from the fault to define, and then combining, via the power divider, the first reflected test signal with the first reference signal to create a combined first reflected test and reference signal at the third port of the power divider; (iv) transmitting the combined first reflected test and reference signal from the third port of the power divider to a measuring device; (v) determining a first voltage magnitude of the combined first reflected test and reference signal with the measuring device; (vi) repeating steps (i)-(v) for at least a second test signal to determine a second voltage magnitude of a combined second reflected test and reference signal; (vii) calculating a distance to the fault in the electrical network based, at least in part, on the first voltage magnitude and the second voltage magnitude; and (viii) one of the following: (a) effecting or recommending the repair of the DUT by another based on the distance to the fault, or (b) repairing the DUT based on the distance to the fault.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

Figure 1:
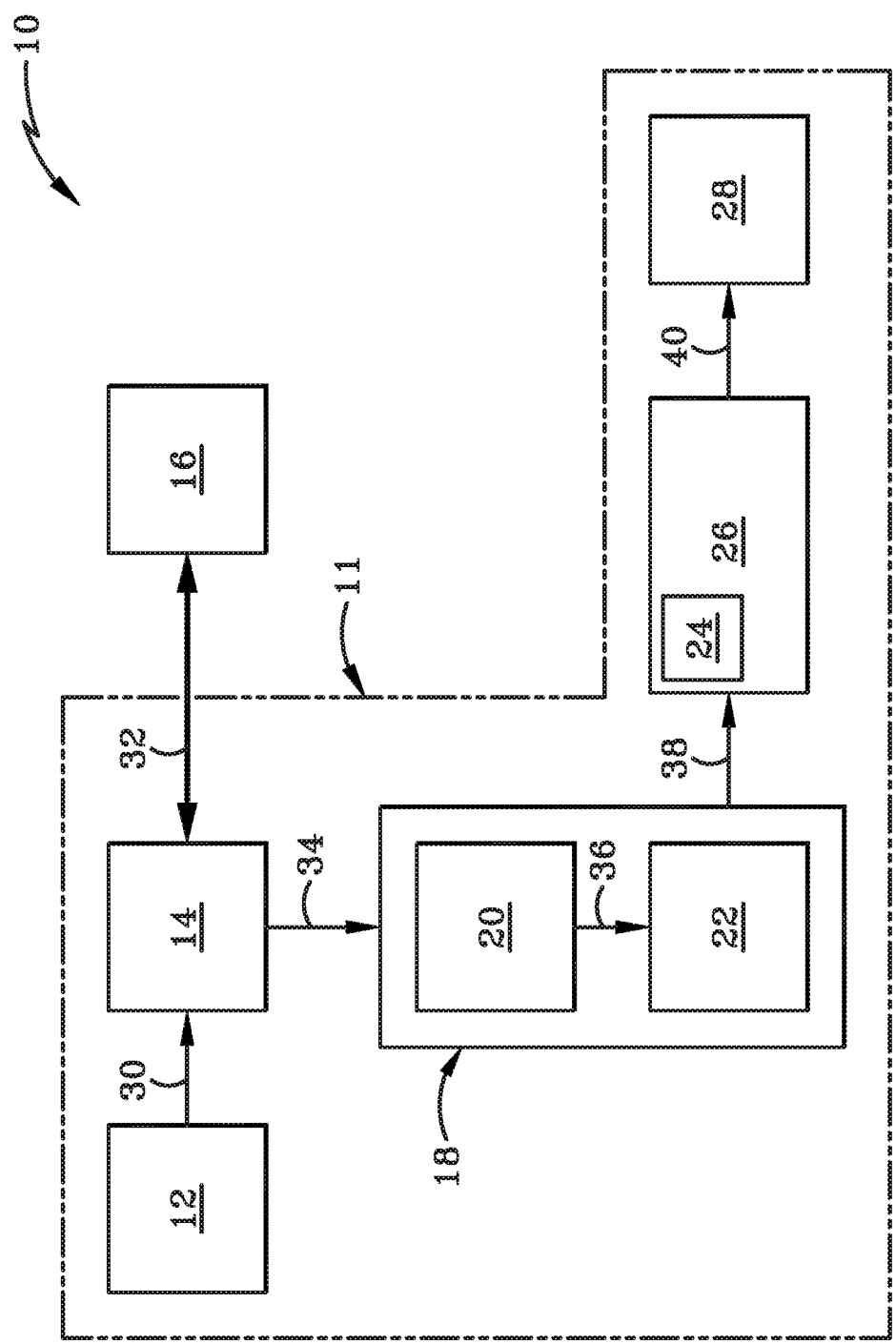
FIG. 1 is a schematic flowchart of a line tester testing a device under test in accordance with one aspect of the present disclosure.

FIG. 1 depicts an exemplary schematic flowchart of a system that determines a distance to fault (DTF) using a power meter or other power measuring device, wherein the system is shown generally at 10. The system 10 includes a tester or testing device 11 that is an operative communication with a device under test (DUT) 16. Tester 11 includes a signal source 12, a power divider 14, a power detector 18 comprising of power sensor 20 and a power meter 22, a computer having a processor 26 and a storage medium 24, and an operator display 28.

With continued reference to FIG. 1, within the tester 11, some elements or components of the tester 11 encounter electrical signals before or after other portions or components of the tester 11 during its operation. Thus, an exemplary flowstream is defined as moving from an upstream direction towards a downstream direction. Accordingly, some elements or components of the system 10, may be described using relative terms such as upstream or downstream from another component of the system 10. For example, the signal source 12 is electrically connected upstream from the power divider 14. Stated otherwise, the power divider 14 is electrically connected to the signal source and positioned electrically downstream therefrom. A transmission line is a configuration of electrically conductive elements, such as a copper or a coaxial cable, which electrically couples the signal source 12 to the power divider 14. Transmission line 30 includes a directional arrowhead indicating that electrical signals flow along the transmission line 30 from the signal source 12 to the power divider 14. More particularly, a reference signal flows along the transmission line 30 at a first frequency generated by the signal source 12 to the power divider 14. The power divider has at least three ports. A first port of the power divider 14 connects with transmission line 30. A second port of the power divider 14 connects with transmission line 32. A third port of the power divider 14 connects with the transmission line 34.

The power divider 14 is electrically connected with the DUT 16 via transmission line 32. Further, power divider 14 is connected with the power detector 18 via transmission line 34. Transmission line 32 carries signals of interest in both directions along the length thereof as indicated by the double arrowheads at each end of the transmission line 32 depicted in FIG. 1. Stated otherwise, the reference signal divided by power divider 14 includes an outgoing portion moving from the power divider 14 to the DUT 16 along transmission line 32.

The DUT 16 may be an electrical system or any electrical device that is being tested to determine where a fault is located in the electrical system. Thus, the device under test is any electrical system having a fault that needs to be identified. As understood in the art, when the reference signal encounters the fault within the DUT 16, a reflected signal reflects from the fault and is then considered a reflected test signal. A reflected test signal may travel in an opposing direction along transmission line 32 towards the power divider 14. The reflected test signal then may enter the power divider 14. Transmission line 34 electrically connects the power divider 14 to the power detector 18. Power detector 18 (i.e., a power measuring device) is positioned electrically downstream from the power divider 14. Transmission line 34 carries the reference signal and the reflected test signal there along. More particularly, the reference signal and the reflected test signal combine in the power divider 14 to form a combined reference and reflected test signal.

The combined reference and reflected test signal transmits through transmission line 34 to the power detector 18. Within power detector 18, the power sensor 20 detects the amplitude of the combined reference and reflected test signal. However, other types of sensors or detector are entirely possible. For example, other devices that measure voltage or power are oscilloscopes. From power sensor 20, the combined reference and reflected test signal are transmitted through transmission line 36 to the power meter 22 which is electrically downstream from the power sensor 20. The power meter 22 is configured to measure or identify power of the combined reference and reflected test signal. The power meter 22 may further have an analog-to-digital converter (ADC) component.

After the power sensor 20 and the power meter 22 have collected and detected the power or voltage associated with the combined reference and reflected test signal, the power detector 18 transmits the results of its detection along transmission line 38 to the computer having a processor 26 and coupled storage medium 24. Thus, the computer having a processor 26 and storage medium 24 is positioned electrically downstream from the power detector 18. As will be described in greater detail below, the storage medium 24 stores the results of the power detector 18 for processing by the computer having a processor 26. In one particular embodiment, the computer having a processor 26 may execute instructions for a plurality of combined reference and reflected signals at different frequencies and as such the storage medium 24 will collectively store the detected results from the power detector 18 for simultaneous processing by the computer having a processor 26. Thereafter, the results of the processing may be provided along transmission line 40 for display by the operator display 28, however display 28 is not necessary for performing the operative functions of the present disclosure. Thus, the computer having a processor 26 and associated storage medium 24 are electrically downstream from the power detector 18, and the operator display 28 is electrically downstream from the computer having a processor 26 and associated storage medium 24.

Figure 2:
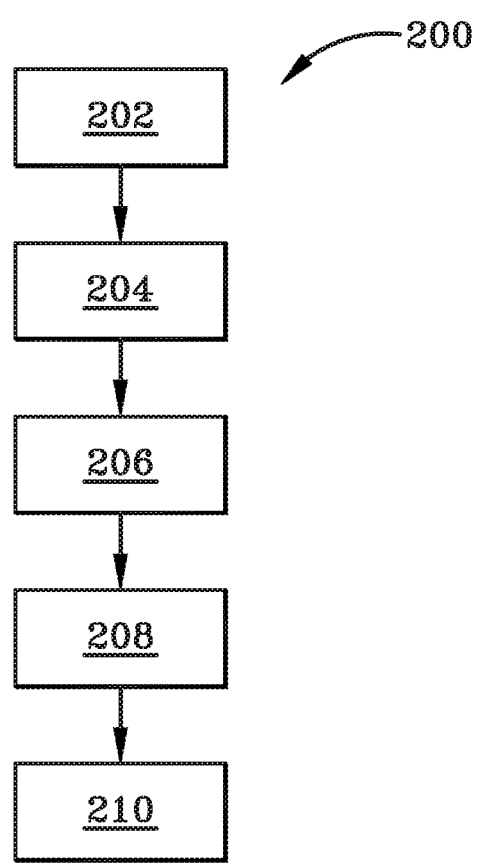
FIG. 2 is a flowchart representing the processing of the data obtained by the line tester using a Hilbert transform computation.

The processing that occurs within the computer having a processor 26 and associated storage medium 24 is identified more particularly with reference to FIG. 2. FIG. 2 depicts an exemplary method at 200 that determines a complex valued signal S that is minimum phase. The complex valued signal S is the reconstruction of the entire signal based only on its magnitude in the frequency domain. More particularly, the system collects the power (P) or voltage (V) at equally spaced points in the frequency domain which is shown generally at 202. While this particular example indicates that the power is collected at equally spaced intervals within the frequency domain, other intervals are entirely possible such as random intervals or patterned intervals, but these may require additional calculations to accommodate the different frequency spacing.

With continued reference to FIG. 2, after collecting the power P, the system converts the power P to a voltage magnitude (V), which is shown generally at 204. However, while this conversion is utilized above in a preferred embodiment, it is also possible to directly collect or determine the voltage magnitude (V). Then, the system computes the natural log of each element of the sequence of values of V, and stores them in an array (L) and then computes the discrete Hilbert transform of L, which is shown generally at 206.

The equation associated with computing the discrete Hilbert transform is K=discrete Hilbert (natural log of L), wherein K is an array that contains the estimate of the phase at each frequency of the signal S that the system is reconstructing. Then, the system computes the complex valued number (C) using the magnitude V and phase k, wherein k denotes the phase estimate at one frequency, which is shown generally at 208. The system computes C using the equation C=V*exp (j*k), stated otherwise $C=Ve^{j*k}$, where $j=\sqrt{-1}$. Then a discrete signal S is created using each element C. S is a complex valued frequency domain signal composed of all values of C. S is the estimate of the frequency domain response of the system. Then vector processing is employed on the complexed valued signal S, which is shown generally at 210. The vector processing of 210 may include an Inverse Discrete Fourier Transform from which time and distant to fault measurements can be made. The vector processing also includes the use of vector network analysis through one port calibration using calibrated test standards such as short, open, and load (i.e. precision termination). Once the system is calibrated, accurate frequency domain and time domain measurements can be made on the DUT 16.

Figure 3:
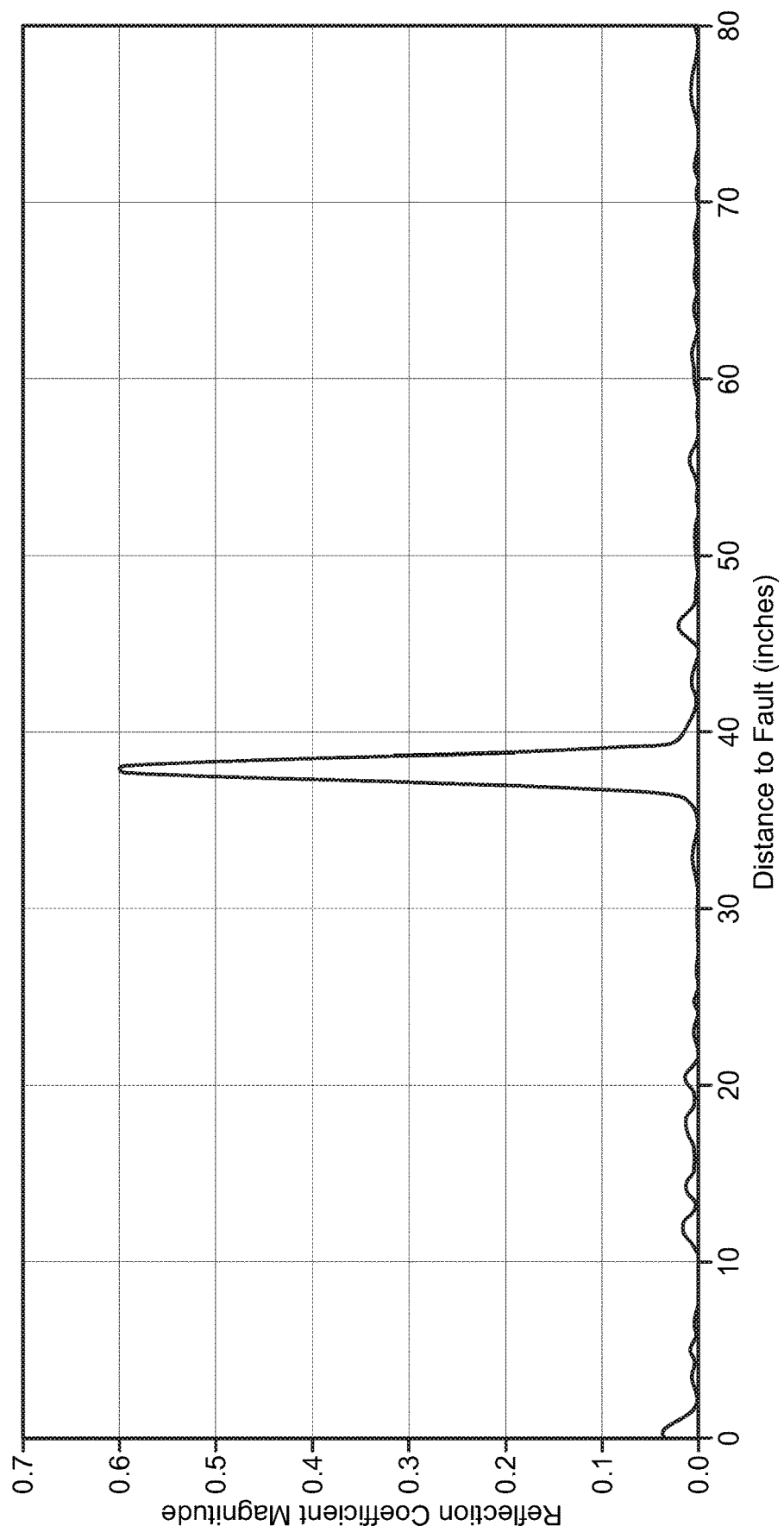
FIG. 3 is a graph depicting the response of the signal after processing from an open circuit located at about 38 inches from the beginning of the device under test.

FIG. 3 depicts a graph of an exemplary response identified in the operator display 28 after processing complex valued signal S from method 200 from an open circuit located at about 38 inches from the entrance of the DUT 16. The X axis indicates the distance to fault in inches and the Y axis identifies the reflected signal magnitude. The peak or large spike at 38 inches identifies the open circuit in the DUT 16 effecting the reflected signal identifying the peak of the reflection coefficient magnitude.

Figure 4:
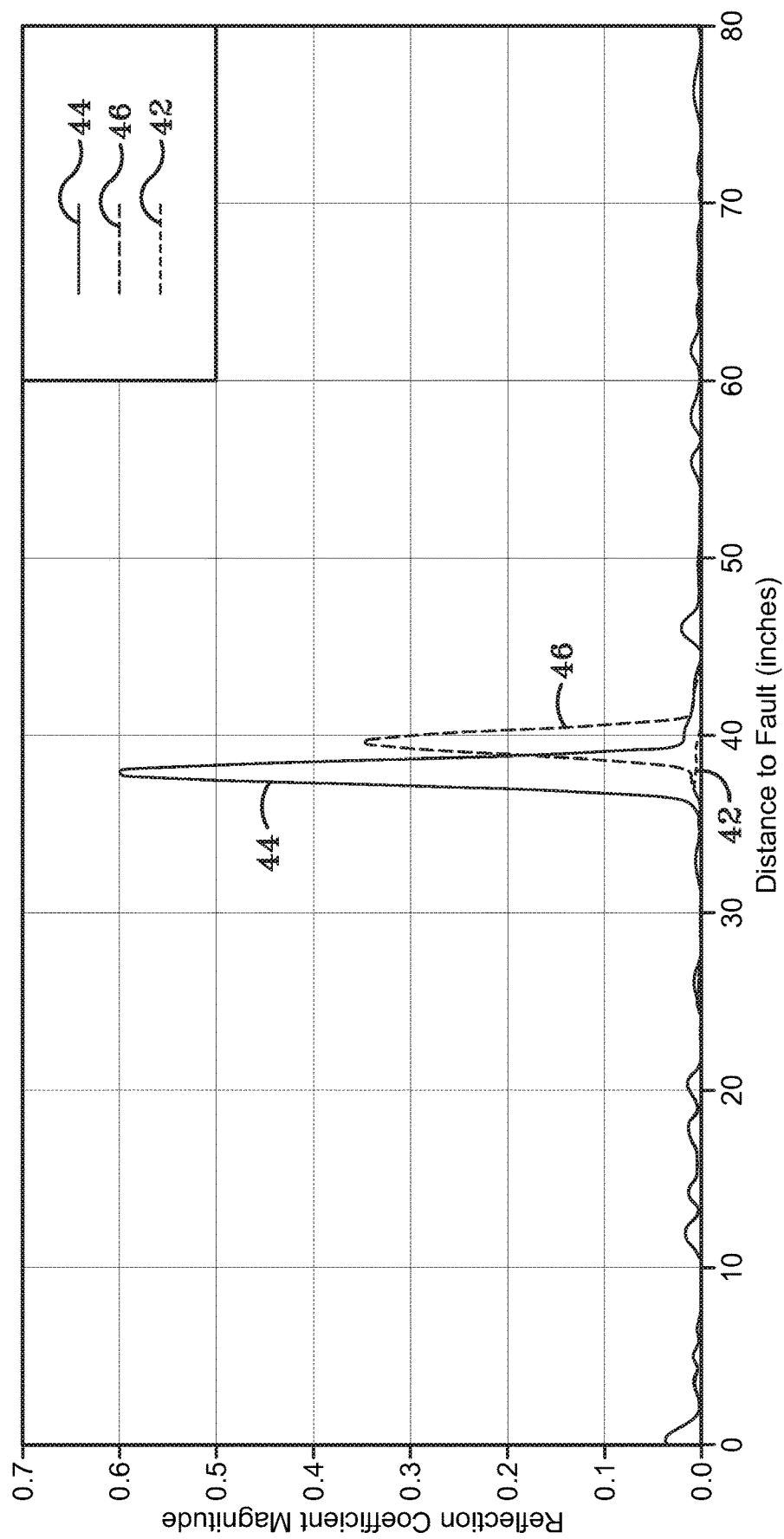
FIG. 4 is a line graph depicting the response after processing from three different electrical components located at about 38 inches from the beginning of the device under test.

FIG. 4 depicts a graph similar to FIG. 3 but rather having one component located at about 38 inches from the beginning of the DUT 16. The first line 42 represents a 50 ohm termination and the reflection coefficient magnitude remains substantially low through the 38 inch distance to fault location as the signals are able to travel completely through the component which represents a normal operating component. Line 44 represents a short in which a high reflection coefficient magnitude is experienced at the 38 inch distance similar to that identified in FIG. 3. Line 46 represents a 3 dB component with a short. In this instance, line 46 representing the 3 dB component with a short has a smaller reflection coefficient magnitude than a complete short represented by line 44. However, the 3 dB shorted component still identifies that the component is faulty when compared to the normal operation of a component identified by line 42. Note, that peak magnitude of the line 46 representing the 3 dB component is offset a short distance from the peak of line 44. This is due to the fact that the 3 dB component has an electrical length of about 1.7 inches. Thus, line 54 has a peak response that is delayed by 1.7 inches.

Figure 5:
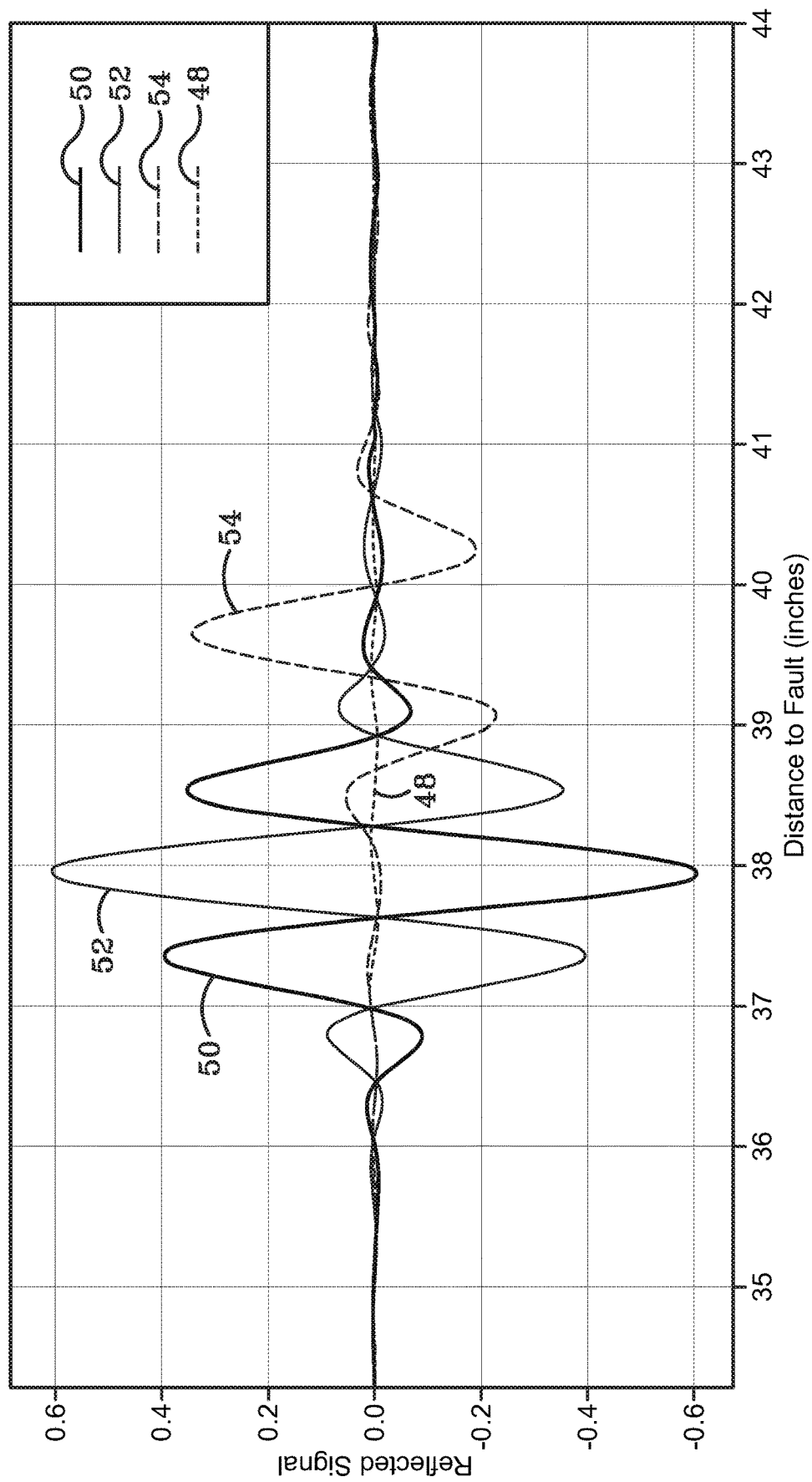
FIG. 5 is line graph of the response after processing from four components located at about 38 inches from the beginning of the device under test. Wherein the four components include an open, a short, a 3 dB attenuator with a short and 50 Ohm termination.

FIG. 5 depicts the response from four components located at about 38 inches from the beginning of the DUT 16. Line 48 identifies the magnitude of the reflected signal of a normal operating 50 Ohm termination component the minimal reflection coefficient magnitude identified by line 48 indicates that there is little to no fault with the component identified by line 48 at the 38 inch mark. Line 50 represents the reflected coefficient magnitude of the signal of an open component and line 52 identifies the reflected coefficient magnitude of a shorted component. As one having ordinary skill in the art would understand, the line 50 is approximately the additive inverse of line 52. Both indicate that at about 38 inches their reflection magnitude coefficient's peak to identify a faulty component in the DUT 16. Line 54 represents a 3 dB attenuator that is shorted on one end having a peak reflected magnitude being shifted from the 38 inch mark. The reason for the shorted 3 dB attenuator being offset from the 38 inch mark is because it is a 3 dB attenuator that has an electrical length of about 1.7 inches. Thus, line 54 has a peak response that is delayed by 1.7 inches.

Having thus described the general configuration and components of system 10, the operation and method of use thereof will now be discussed, along with some non-limiting exemplary advantages.

In accordance with one aspect of the present disclosure, the system 10 is used to test any electrical system, such as modules or even other tester/testing devices, that have a plurality of electrical contacts and components in order to perform the tests to determine which aspect of the electrical system has failed. System 10 may be a part of a larger tester. As indicated previously, the physical contacts of electromechanical relays in the tester itself will sometimes fail. Thus, termination calculations provided herein can be used on any electrical systems, such as the tester, to determine where a failure is within an electrical network.

In previous systems, when a tester had an electrical component that failed, there were multiple approaches that could be utilized to determine which aspect or which component of the testing device failed. For example, a simple iterative process may turn off and turn on various switches until the defective one is located.

In accordance with one aspect of the present disclosure, one advantage relates to the sending of RF energy and receiving of reflected energy in a cost effective manner so as to efficiently and effectively determine the location of a fault within an electrical system. In one aspect, the system is the tester, but in other scenarios the electrical system may be any electrical system. Further, the system enables improved computation of determining a faulty electrical component within an electrical system by using existing low cost and widely available components.

The system 10, which may be a module tester, includes a power sensor that can determine the power of a signal at one frequency at a time in the form of a continuous wave signal. The power detector 18 is able to observe the continuous wave (CW) RF signals that have been transmitted and the power detector 18 determines the average power of that particular CW signal. Then, since the CW power detector 18 can only detect a single CW signal at a given time, the system repeats this process for a number of frequencies within a frequency band, which may include a wide range of frequencies, the system is able to then reconfigure the information and calculate time information of the reflected signal energy. Typically, to determine time information from measurements in the frequency domain, a test signal and reference signal that are coherent are required. The coherent signals are used to measure phase from which time information can be computed. Time information can also be found by using pulses as the stimulus. One exemplary method of determining the time information or time marking is by using a pulse. In this instance, a pulse is sent out and the system calculates how long it takes for the pulse to be sent out and be reflected back. Typically, this time frame is only the order of picoseconds or nanoseconds. The other time marking determination is accomplished through coherent test and reference signals in the frequency domain which enables the system to determine the phase and the amplitude and multiple signals are put out and the phase and amplitude are calculated over a range of frequencies and from that frequency spectrum, the Inverse Discrete Fourier Transform can be used to compute the time domain response with a time resolution on the order of picoseconds or nanoseconds that can be used to determine where the reflection in the electrical network was generated.

The present disclosure differentiates itself from the two previous methods of identifying the time marking by only needing the amplitude of the CW signal and the system is able to determine the coherency aspect of it or the phase. The present disclosure takes advantage of a Hilbert transform to accomplish this coherency or phase determination.

In accordance with one aspect of the present disclosure, the system 10 takes advantage of a Hilbert transform to compute a time domain or a frequency domain reflectometry analysis as well as to identify a fault measurement in an electrical system. Taking advantage of the Hilbert transform, system 10 is able to determine automatically the distance to fault measurements within the electrical system that is under test (i.e., DUT 16). For example, if the system has the magnitude of the signal, then Hilbert transform can automatically generate the phase of that signal under certain conditions. Namely, the goal of this process is to compute the system response in time from the amplitude of the frequency spectrum of that time domain system response.

The Hilbert transform is used to compute the phase at each frequency in the frequency spectrum. The Hilbert transform requires that system 10 know the amplitude of a group of distinct equally spaced (across a band of frequencies) continuous wave signals. From that information, the system 10 may compute the phase at each of those frequencies using the Hilbert transform. This system 10 and method assumes that the original time domain response meets a condition known as minimum phase. From the phase and amplitude system 10 converts the frequency domain signal to its real and imaginary parts. The Inverse Discrete Fourier Transform can then be computed and a time domain signal is the result. The Inverse Discrete Fourier Transform computes time information from which distance can be inferred by knowledge of the propagation time in a cable or transmission line.

The signal measured by the power meter has to be "Minimum Phase". The signal measured includes a strong signal coming directly through the power divider 14 and a second signal that includes the reflections from the DUT 16. For example, a minimum-phase system, whether discrete-time or continuous-time, has an additional useful property that the natural logarithm of the magnitude of the frequency response (i.e., the gain) is related to the phase angle of the frequency response (measured in radians) by the Hilbert transform. It requires that a broad range of frequencies be used. The frequency range and spacing of the frequencies depends on the time of travel of the signal to be measured/tested and the desired resolution. Longer distance of travel requires closer frequency spacing. Better resolution requires broader frequency range.

In accordance with one aspect of the present disclosure and with operational reference to FIG. 1, the power divider 14 may be added to the tester 11. As one having ordinary skill in the art understands, the two-way power divider 14 is also operable as a power combiner. For example, if a signal enters a first port of the device, that signal will be divided equally with some loss and arrive on each of the other two ports. If a first signal and a second signal enter a first port and a second port respectively, the combination of a first signal plus the second signal will arrive at the third port. The power divider 14 is operative to provide the coherency information in the signal. Stated otherwise, signal flows from the signal source into the power divider, the signal is divided such that half of the signal is output to the DUT 16 and the other half of the signal that is divided is output towards the power sensor. For the first half, the signal moving towards the device under test will travel into the device under test and reflect from the location where there is a fault in the device under test. The reflected signal returns towards the power divider and is then considered a reflected test signal. When the reflected test signal returns to the power divider, half of the reflected test signal travels along the same path as the second reference signal towards the power sensor, the other half of the reflected test signal is either absorbed by the power divider/combiner device or directed towards the original signal source. The portion of the reflected test signal that is sent along the line from the power divider towards the power sensor is delayed from the original portion of the reference signal traveling along the same path. Stated otherwise, two signals (half the reflected test signal and the reference signal) traveling along the same path into the power sensor and the reflected test signal is delayed from the reference signal.

In operation and with reference to FIG. 1, the operation of the reference signal and the reflected test signal traveling along the same path towards the power detector 18 as coherent signals which may be out of phase in most scenarios, however, there may be some instances where they are in phase due to their frequency. The power detector 18 measures the power of the combined reference signal and reflected test signal. Then this process is repeated over a large band of frequencies. In one particular example, a frequency band may be in a range from about 4 gigahertz (GHz) to about 8 GHz. The system would then test frequency iterations within this frequency band. In one particular embodiment, the iterations may be repeated in 20 megahertz (MHz) increments over the entire frequency band. For example, the signal source may send a first signal at about 4 GHz through the power divider, it gets divided into a reference signal and the outgoing signal wherein the outgoing signal at 4 GHz enters the device under test and reflects at a time delayed from the reference signal. The reflected test signal is combined with the reference signal in the power combiner device and the power is measured by the power sensor. Then, once the power sensor measurers the power of the 4 GHz originating source signal the process is repeated with a second source signal that is 4.02 GHz. After the power sensor measures the power of the reference signal and reflected test signal originating from the original signal source of 4.02 GHz, the process is then again repeated with an original signal source of 4.04 GHz. The power measurement or detection process by the power sensor is repeated over the entire bandwidth from 4 GHz to 8 GHz. While the 4 GHz to 8 GHz frequency band is operational for the present disclosure, it is to be understood that any frequency band may be utilized depending on the desired application of the testing system without departing from the scope of the present disclosure. For example, other systems have an operational frequency band from 2 GHz to 20 GHz, and others have an operational frequency band from 10 GHz to 18 GHz. Further, the intervals may be any varying interval for the frequency band. In one particular embodiment, the intervals are all equal intervals such as 20 MHz, however, it is possible that the intervals may vary relative to each other or may establish a pattern and some intervals may equal each other but not others. The intervals may be preselected by testing system or the operator thereof or the intervals may be dynamically variable and can program in conjunction with a control or connected with a signal source to vary during the scope of the test. Some exemplary considerations for determining the interval measurements of the signal source include how large is the bandwidth, what is the desired resolution in time (i.e., how closely the system can separate two different reflections) which improves as the frequency band increases, and the separation in frequency is operative to identify the measuring distance. Thus, if the system gets closer and closer in frequency separation, then they system is able to locate broken components in the device under test that are further away. Thus, the frequency interval is an inverse relationship to the distance that the device under test can locate faults.

The power detector 18 is a measuring device that detects power of the combined reference and reflected test signal and digitizes the output of the power sensor and applies correction factors and then sends the information digitally to the processor. In one particular embodiment, the processor 26 may be coupled with at least one non-transitory computer readable storage medium 24 which may store the data for one signal frequency in the storage media until all of the iterations or intervals of the frequencies needing to be ran or performed are aggregated and then processed via a Hilbert transform in the processing box at one time.

In operation and with respect to FIG. 2 and the Hilbert Transform, as being accomplished by the processing step, first, the power detector 18 collects power levels of the signal at each frequency within the frequency band of interest. As stated previously, in some instances, the power may be equally spaced at frequency intervals; however, in other instances the intervals may vary or be patterned. Then the power levels for each frequency interval within the frequency band of interest are converted to a quantity that is proportional to voltage magnitude by taking the square root. Then, the first step of the Hilbert transform is to take the natural log of each of element of the collected voltage magnitudes of the signal and store them in an array. The Hilbert transform is computed on the array of elements. The result of this computation produces the imaginary part of that natural log based signal, which is an estimate of the phase of the signal at that frequency. Then, the phase is used with the equation $C=Ve^{j*k}$, where $j=\sqrt{-1}$. Then the signal S is a complex valued frequency domain signal composed of all the values of C. S is the estimate of the frequency domain response of the system.

Vector processing similar to that performed by a vector network analyzer is then performed on the results of these computations. The vector processing calibrates the system to account for cable losses, cable lengths, and reflections within the measurement system including those coming off the interface, which in one particular embodiment is the location at the end of the cable 32 that interfaces to the DUT 16. The calibration associated with the line 32 between the DUT 16 and the power divider 14, enables the calculation to the end of the cable to be determined within a magnitude of a few picoseconds.

The vector analysis determines the location of the fault in the device under test and the extent of the fault or failure. The extent of the failure, is inferred by the level of the signal that is reflected at the location of a suspected failure in an electrical element. Further, some reflections may be generated by an interface between the ends of two connected RF cables. For example, RF cables are often formed from Teflon, an interface between adjoining cables may create some minor reflections based on the similarities or differences between the two Teflon pieces of the adjacent cables. If the Teflon is not completely identical then the interface between the two elements will create a slight reflection. So, in accordance with an aspect of the present disclosure, failure in the device under test does not necessarily mean a complete and catastrophic failure of an electrical element but rather could refer to a reflecting location caused by a poor connection between two interfaced portions of RF cables that are not matched well with each other. Thus, a switch could be "broken" even though it is seemingly working and operable; however, the reflections generated by the interfaces could inhibit maximal performance.

In operation, and with reference to FIG. 4 and as alluded to above, when the one-half output from the power divider is sent to DUT 16, the magnitude of the test signal reflected at a fault location may vary in magnitude depending on the extent of the fault. For example, if there is a total and complete short in the DUT 16, the magnitude will be greater, as indicated by the line 44 representing a complete short compared to that of a 3 dB attenuator with a short indicated by line 46.

With continued reference to FIG. 4, the first component has a complete short (i.e., line 44), the second component (i.e., line 46) is a partial fault with three dB of attenuation and then a short, and the third component (i.e., line 42) is a 50 Ohm termination. The 50 Ohm termination (fully operational device) represented by line 42 is at a very low reflection coefficient magnitude along the entire X axis representing that the third component is fully operational. The first component located at about 38 inches having a complete short has a greater reflection coefficient magnitude than the partially faulty component having a three dB attenuator with short. Thus, these spikes in magnitude provide the testing system fairly accurate representation in the time domain of where the fault in the device under test is located. As will be described in greater detail below, the testing system may then use the time delay to determine which components are faulty based on their known distance, which is calculated based on the time delay, of the faulty components so that they may be repaired or replaced. As will be described in greater detail below, the testing system may then use the time resolution to determine which components are faulty based on their known distance, which is calculated based on the time resolution, of the faulty components so that they may be repaired or replaced.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone utilized to execute the software code or instructions via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

What is claimed:

1. A method of characterizing an electric network, the method comprising:
   (i) receiving a first signal at a first port of a power divider;
   (ii) splitting the first signal, via a power divider, into a first reference signal and a first test signal and then transmitting the first test signal from a second port of the power divider to a device under test (DUT);
   (iii) transmitting the first test signal through a portion of the DUT until the first test signal encounters a fault or discontinuity in the DUT, wherein the first test signal reflects as a first reflected test signal from the fault or discontinuity, and then combining, via the power divider, the first reflected test signal with the first reference signal to create a combined first reflected test and reference signal at a third port of the power divider;
   (iv) transmitting the combined first reflected test and reference signal from the third port of the power divider to a measuring device;
   (v) determining a first voltage magnitude of the combined first reflected test and reference signal with the measuring device;
   (vi) repeating steps (i)-(v) for at least a second test signal to determine an at least second voltage magnitude of a combined second reflected test and reference signal;
   (vii) computing values (X) of the natural logarithm of the first voltage magnitude and the at least second voltage magnitudes (V); and
   (viii) computing phase values (I) from a discrete Hilbert transform of a sequence of X values, wherein I is the estimate of the phase associated with each of the at least two voltage magnitudes when the combined signal is a minimum phase signal.

2. The method of claim 1, wherein determining a voltage magnitude of the combined first reflected test and reference signal with the measuring device includes:

detecting the power of the combined first reflected test and reference signal via a power meter.

3. The method of claim 1, wherein determining a voltage magnitude of the combined first reflected test and reference signal with the measuring device includes:
   detecting a voltage of the combined first reflected test signal and reference signal via an spectrum analyzer.

4. The method of claim 1, wherein determining a voltage magnitude of the combined first reflected test and reference signal with the measuring device includes:
   detecting, via a diode, a voltage of the combined first reflected test signal and reference signal.

5. The method of claim 1, further comprising:
   determining a frequency spacing interval between a first frequency of the first test signal and a different second frequency of the second test signal based on a time of travel of the respective signal to be measured and tested.

6. The method of claim 1, further comprising:
   computing a signal (S) which is an array comprised of values C computed at each frequency with the equation C=V*exp (j*k), where j equals the square root of −1 and k equals the estimated phase at each frequency; and the signal S is a complex number or vector sequence in the frequency domain.

7. The method of claim 6, further comprising:
   processing the signal (S), via an Inverse Discrete Fourier Transform, to determine a time measurement.

8. The method of claim 7, further comprising:
   processing the time measurement to determine a distance to fault measurement.

9. The method of claim 1, further comprising:
   calibrating a port between the power divider and the DUT using calibration standards including at least one of a short, an open, or a load.

10. The method of claim 9, further comprising:
   processing the calibrated signal, via an Inverse Discrete Fourier Transform, to determine a calibrated time measurement.

11. The method of claim 10, further comprising:
   processing the calibrated time measurement to determine a distance to fault measurement.

12. The method of claim 1, further comprising:
   processing the calibrated signal, via an Inverse Discrete Fourier Transform, to determine a calibrated time measurement.

13. The method of claim 12, further comprising:
   processing the calibrated time measurement to determine a distance to fault measurement.

14. The method of claim 1, wherein the first and second test signals are part of a plurality of test signals that are equally spaced in the frequency domain.

15. The method of claim 1, further comprising:
   calculating a distance to the fault in the electrical network based, at least in part, on the first voltage magnitude and the second voltage magnitude.

16. The method of claim 15, further comprising:
   one of the following: (a) effecting another person or entity to repair the DUT based on the distance to the fault, or (b) repairing the DUT based on the distance to the fault.

* * * * *